United States Patent Office
3,725,069
Patented Apr. 3, 1973

3,725,069
DIAZO LITHOGRAPHIC COMPOSITION AND ARTICLE

Oswyn K. Hammond, Westbrook, Maine, assignor to Scott Paper Company, Delaware County, Pa.

No Drawing. Filed Sept. 13, 1971, Ser. No. 180,067
Int. Cl. G03c *1/54;* G03f *7/08*
U.S. Cl. 96—75 4 Claims

ABSTRACT OF THE DISCLOSURE

Photosensitive compositions comprising a copolymer of styrene and allyl alcohol and a lithographic diazo compound.

BACKGROUND OF THE INVENTION

Field of the invention

This invention relates to photopolymer compositions, more particularly to a photopolymer composition comprising a resinous binder and a lithographic diazo compound, and to lithographic printing plates employing the same.

Description of the prior art

A lithographic diazo which is rendered insoluble by exposure to light passing through the transparent areas of an original or master transparency is referred to as "negative-working." Those areas struck by light are ink-receptive and form the areas from which the image is printed. In the unexposed portions of the plate, the soluble diazo is removed by the application of a "developing" solution, which contains a suitable solvent for the diazo, thereby exposing water-receptive areas which form the background for the image on the plate. The printing plate image thus produced is the inverse of that on the original, hence the term "negative-working."

In the use of negative-working lithographic plates referred to in the art as "subtractive" plates, the still-soluble or unhardened background areas are wiped away or "subtracted," leaving hardened, ink-receptive photosensitive material in the image areas. The operation of the subtractive plate is based upon the ability to apply a thick enough layer of photosensitive material to provide an image area of satisfactory run length. Thus, in general, the thicker the layer, the greater the run length. In an older type of plate, referred to as an "additive" plate, after exposure and development of a relatively thin photosensitive layer such as a diazo layer, the image areas were rendered more durable through the addition of an abrasion-resistant coating to the image areas. The application of this coating is usually accomplished by rubbing onto the surface of the plate a liquid containing an organophilic material which is adherent to the diazo remaining in the light exposed areas. Such a liquid is referred to in the art as an "image developer."

Subtractive plates have several advantages over the additive type. While even skilled platemakers have difficulty achieving consistent results with an image developer, development of subtractive plates involves merely wiping away the unhardened background. The simplicity of this step obviously lends itself well to automated processing. Furthermore, inclusion of a pigment in the lithographic coating, provides a visible image upon development, which is very helpful to the platemaker.

Workers in the lithographic art have been seeking a resinous binder for lithographic diazo compounds which would provide a strong and durable image for a subtractive lithographic printing plate. The approach of incorporating a resinous binder with the photosensitive compound has been hitherto regarded as unsuccessful. See U.S. Pat. No. 3,136,637 at column 2, lines 3 through 21 which reports that such plates are difficult to manufacture because of solubility problems and that the press life of such plates is little, if any, greater than conventional plates. Even recent developments utilizing this approach have recommended the application of a coating to the developed image to achieve a large number of copies. See U.S. Pat. No. 3,544,317, column 4.

SUMMARY OF THE INVENTION

Accordingly, it is an object of the present invention to provide a resinous binder which, when combined with a lithographic diazo compound, forms a photopolymer composition.

A further object of this invention is to provide a new photopolymer for use in lithographic printing plates.

Another object of this invention is to provide an improved photolithographic printing plate having greater run length.

The present inventor has found that a copolymer of styrene and allyl alcohol in combination with a solvent-soluble, negative-working diazo compound provides a photopolymer which exhibits outstanding adherence to surfaces of materials such as those normally employed as substrates for lithographic printing plates. This photopolymer, when utilized in a photolithographic printing plate, provides a plate of exceptional press life.

When the copolymer is combined with the reaction product of an anionic surfactant and water-soluble, light-sensitive polyfunctional diazonium salts, said reaction product being more fully described in copending patent application, Ser. No. 138,336, a photopolymer results which is extremely hard and tough and, when utilized in a lithographic printing plate, provides a plate of outstanding press life.

In the copending application it is disclosed that the condensation product of a diphenylamine-4-diazonium salt with formaldehyde can be reacted in an aqueous medium with certain anionic surfactants and that the reaction product thus formed, which is water-insoluble, readily precipitates out of the reaction medium. Preferred light-sensitive compounds are the condensation products of para-diazo-diphenylamine and formaldehyde (1) formed from a sulfuric acid medium and stabilized with zinc chloride, commercially available from Kalle Aktiengesellschaft of Wiesbaden-Biebrich, Germany, under the designation MN30 and (2) formed from a phosphoric acid medium, sold by Kalle Aktiengesellschaft under the designation MN59.

The largest group of anionic surfactants is the group of alkyl sulfates having the general formula $RSO_4H$. The compounds usually commercially available are the "alcohol sulfates," made by sulfating alcohols and neutralizing with caustic or amines. Most are sold as the sodium salt, $RSO_4Na$, formed by neutralization with sodium hydroxide. Satisfactory results have been obtained with the reaction product formed from the following mono-alkyl sulfates: n-butyl, amyl, hexyl, cyclohexyl, octyl, lauryl, oleyl, and stearyl. Many alkyl sulfate surfactants are available commercially. They can be prepared by the following simple laboratory procedure. To the alcohol dissolved in methylene chloride is added an equimolar amount of chlorosulfonic acid diluted with methylene chloride. After the evolution of hydrogen chloride, the solvent is evaporated, leaving the sulfate as a residue which will vary from an oil in the case of n-butyl, to a waxy solid in the case of stearyl.

In addition to the so-called alcohol sulfates, there exists a variety of sulfates with more complex aliphatic or aromatic components which have been found operable in the present invention. Examples include ammonium lauryl ether sulfate (sold commercially as Sipon EA by Alcolac Chemical Company), an alkylaryl sulfate, para-nonylphenol sulfate, and two aryl-substituted aliphatic sulfates, 2-phenyl ethylsulfate and sodium iso-octyl phenoxy diethoxyethyl sulfate (sold commercially as Triton 770 by Rohm and Haas Chemical Company).

Another group of surfactants is characterized as aliphatic sulfonates having the general formula $RSO_3H$ where R is a hydrocarbon, not necessarily a straight-chain hydrocarbon. Examples include sodium dioctyl sulfosuccinate, $C_{20}H_{37}O_4SO_3Na$, and lauryl sulfonate, $C_{12}H_{25}SO_3H$. A further type of aliphatic sulfonate comprises arylalkyl sulfonates, which may be characterized as $ArRSO_3H$, the sulfonic acid group being directly attached to an aliphatic group. While such surfactants are not commercially available, they can be prepared by oxidizing in nitric acid a compound of the general formula ArRSH, for example, 3-phenyl-1-propanethiol.

Yet another group of operable surfactants includes alkylaryl sulfonates, which may be characterized as $RArSO_3H$, the sulfonic acid group being directly attached to an aromatic ring. Examples include tertiary butylbenzene sulfonate, para-cyclohexyl benzene sulfonate, dodecyl benzene sulfonate, stearyl benzene sulfonate, and isopropyl naphthalene sulfonate.

In the case of the aliphatic (including arylalkyl) sulfate and sulfonate surfactants, if the total carbon chain has less than four members, only a small amount of reaction product is obtained and it is difficult to recover from the aqueous medium. The reaction product is not considered water insoluble unless this minimum chain length is provided. In the case of the alkylaryl sulfates and sulfonates, where the aryl moiety is phenyl, the carbon chain attached to the phenyl group must have four members in order to provide a compound which may be regarded as an anionic surfactant for the purpose of the present invention. In the case of alkylaryl sulfates and sulfonates where the aryl moiety is naphthyl, an aliphatic chain length of three suffices.

Accordingly, the surfactant is defined in copending application Ser. No. 138,336 by the following general expression:

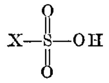

where X is R or RO and R is an aliphatic moiety of more than three carbon atoms, which is straight chain, branch chain or aryl-substituted, or X is RAr or RArO and when Ar is phenyl R is an aliphatic moiety of more than three carbon atoms and when Ar is naphthyl R is an aliphatic moiety of more than two carbon atoms, R being straight chain, branch chain or cyclic.

It is largely immaterial whether free acids or salts of any of these surfactants are employed in producing the new diazos.

The photopolymer of the present invention is insoluble in water but soluble in a wide range of organic solvents. Like the diazo incorporated in it, the photopolymer is negative-working; light causes crosslinking between the diazo and the copolymer of styrene and allyl alcohol, and hence insolubilizes the polymer. When utilized in a photolithographic printing plate, the photopolymer is rendered insoluble by exposure to light which passes through the transparent areas of an original or master transparency. In the unexposed portions of the plate, the soluble photopolymer is removed by the application of a suitable solvent for the polymer.

The photopolymer of the present invention, when employed in a photolithographic printing plate, provides an image which is highly resistant to wear and which firmly bonds to a widely-used support for lithographic printing plates, namely aluminum, and particularly anodized aluminum. These properties enable plates of the present invention to produce up to 50,000 copies and also make the plates resistant to over-development, that is, it is difficult to remove the polymer in the exposed areas by excessive rubbing with the developing solution. Furthermore, the exposed polymer is highly receptive to ink, thus making the plate easy to start on the press. The unexposed polymer is readily removed by a great variety of solvents, thus affording considerable latitude in choice of solvent for development of the plate.

An illustrative example of the resin useful in the present photopolymer composition is De Soto resin 461–114 sold by De Soto, Inc. of Des Plaines, Ill. This is a resinous polyol corresponding to the structure

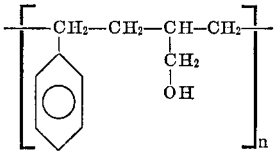

It is believed that two parts of styrene to one part of allyl alcohol are employed in forming the copolymer sold under the designation 461–114. It is supplied as hard, non-tacky flakes which have an acid number less than 0.5, a hydroxyl content of 5.4–6.0% and a molecular weight of approximately 1600. The resin is soluble in aromatic hydrocarbons, alcohols, esters and ketones.

Reaction products of the condensation products of paradiazo-diphenylamine and formaldehyde with sodium lauryl sulfate, n-octyl hydrogen sulfate, sodium cyclohexyl sulfate, n-stearyl hydrogen sulfate, and with a large number of aromatic sulfonic acids, including p-toluene sulfonic acid, work satisfactorily in combination with the copolymer of styrene and allyl alcohol resin. The diazo prepared from n-stearyl hydrogen sulfate and Kalle's MN59 is preferred for its faster photographic response. The concentration of diazo material in the resin is not critical, from 5–500% by weight of the resin giving excellent results.

Utilizing suitable subbing layers and appropriate selection of resin, the photopolymer composition of the present invention may be applied to a wide variety of substrates such as aluminum, glass, Mylar (polyester), copper, paper, semiconductive silicon, magnesium and stainless steel. Substrate materials preferred for use in making photolithographic plates in accordance with the invention include brush-grained and silicate-treated aluminum and etched, anodized and silicated aluminum. The differences in the characteristics of these various substrates and their preparation for coating in order to achieve an adherent coating are well known in the art and the appropriate manipulation of the substrate and coating composition are deemed to be within the ability of one of ordinary skill in the art to which the present invention pertains. Any suitable coating technique known in the art, such as the use of spinners, curtain coaters, air knife, reverse-roll or fountain coating can be employed to apply the photopolymer composition.

As will also be appreciated by one of ordinary skill, the solvent in which the resin is dissolved, and consequently the solvation of the resin, can influence the adherence to the substrate. Thus, as is known in the art, the performance of the resin can be optimized by an appropriate choice of solvent for the resin. Examples of solvents from which such selection may be made include 2-methoxyethanol, 2-ethoxyethanol, methylethylketone, chloroform, isopropanol, n-propanol, butyrolactone, and a 60/40 mixture of toluene and ethanol.

The following preferred embodiments more fully illustrate the present invention.

EXAMPLE I

To an aqueous solution containing 2½% by weight of paradiazodiphenylamine - formaldehyde condensation product formed from a phosphoric acid medium, Kalle's MN59, was added an equal volume of an aqueous solution containing 1% by weight of sodium lauryl sulfate (dodecyl sodium sulfate). The precipitate formed as lumps of a yellow crystalline solid which was separated by filtration and washed with water. A ten percent solution of the precipitate in a mixed solvent of 60% toluene and 40% isopropanol was prepared.

A solution of a copolymer of styrene and allyl alcohol, De Soto's 461–114, is prepared by dissolving the resin in 2-methoxyethanol (Methyl Cellosolve) to provide 10% by weight resin.

A photosensitive coating composition was prepared as follows:

| Component: | Parts by weight |
|---|---|
| Resin solution | 10 |
| Diazo solution | 5 |
| Blue pigment | 0.1 |

The blue pigment was Du Pont's Monastral Fast Blue, copper phthalocyanine, Pigment Blue 15, Color Index No. 74160.

The coating composition was applied at the rate of one pound per 3300 square feet, dry weight basis, by means of a No. 10 Meyer bar to a 5-mil sheet of aluminum which had been chemically etched, anodized and silicated. The plate thus formed was imaged with a 7.7 kilovolt-amp carbon arc lamp at a distance of 25 inches for 45 seconds and developed by swabbing with an aqueous solution containing n-propanol and ammonium sulfite to remove the unexposed photopolymer. When mounted on a lithographic press, the plate produced 50,000 copies.

EXAMPLE II

A paper base of the kind used for direct-image lithographic master imaged usually in a typewriter, coated with the formula of Example I, and exposed for 45 seconds to a carbon arc, was washed with 2-methoxyethanol. Unexposed areas were instantly removed, and exposed areas were completely insoluble. It ran cleanly on a conventional lithographic press.

EXAMPLE III

The formula of Example I was coated onto a substrate comprising a laminate of paper, aluminum foil and cross-linked poly(vinyl alcohol) as the hydrophilic surface. It was exposed through a half-tone negative for 45 seconds to a carbon arc as previously described. Development was effected by swabbing with the developer of Example I, but with 10% butyrolactone added to make it more active. Bonding of image areas to the substrate was excellent.

A photopolymer composition has been described which employs a solvent-soluble diazo and a copolymer of styrene and allyl alcohol. When exposed to light, the material is completely insolubilized, while the unexposed areas remain soluble in a wide variety of solvents. A principal application is in the preparation of subtractive lithographic plates, where the extreme toughness of the exposed material gives a very long run-length to the plate.

While the invention has been particularly described with reference to preferred embodiments thereof, it is understood that various other changes and modifications thereof will occur to a person skilled in the art without departing from the spirit and scope of the invention as defined by the appended claims.

What is claimed is:

1. The photopolymer composition comprising a solvent-soluble, negative-working diazo compound and a copolymer of styrene and alkyl alcohol wherein the diazo compound is the reaction product of an anionic surfactant and the condensation product of a diphenylamine-4-diazonium salt with formaldehyde, the surfactant corresponding to the general formula

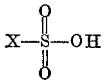

wherein X is R or RO and R is an aliphatic moiety of more than three carbon atoms which is straight chain, branch chain or aryl-substituted, or X is RAr or RArO wherein Ar is a phenyl or a naphthyl moiety and when Ar is phenyl R is an aliphatic moiety of more than three carbon atoms and when Ar is naphthyl R is an aliphatic moiety of more than two carbon atoms, R being straight chain, branch chain or cyclic.

2. The composition according to claim 1 wherein the surfactant is an alcohol sulfate.

3. A photosensitive lithographic printing plate comprising a substrate, and overlying the substrate, a layer of the composition according to claim 1.

4. A photosensitive lithographic printing plate comprising a substrate, and overlying the substrate, a layer of the composition according to claim 1.

References Cited

UNITED STATES PATENTS

| | | | |
|---|---|---|---|
| 2,649,373 | 8/1953 | Neugebaver et al. | 96—91 R X |
| 2,739,889 | 3/1956 | Neugebaver et al. | 96—91 R X |
| 2,980,534 | 4/1961 | Printy et al. | 96—49 X |
| 2,990,281 | 6/1961 | Printy et al. | 96—91 R X |
| 3,219,447 | 11/1965 | Neugebaver et al. | 96—33 |
| 3,235,382 | 2/1966 | Neugebaver et al. | 96—33 |
| 3,376,138 | 4/1968 | Giongualano et al. | 96—35.1 |
| 3,396,019 | 8/1968 | Uhlig | 96—75 X |
| 3,475,176 | 10/1969 | Rauner | 96—35.1 X |
| 3,544,317 | 12/1970 | Yonezawa | 96—33 |
| 3,556,793 | 1/1971 | Field et al. | 96—35.1 |

FOREIGN PATENTS

| | | | |
|---|---|---|---|
| 39/4,273 | 4/1964 | Japan | 96—91 R |

OTHER REFERENCES

Dinaburg, M.: "Photosensitive Diazo Compounds," The Focal Press, 1964, pp. 161–172.

CHARLES L. BOWERS, Jr., Primary Examiner

U.S. Cl. X.R.

260—141, 142; 96—33, 91 R, 115 R